(12) United States Patent
Feng et al.

(10) Patent No.: US 10,797,226 B2
(45) Date of Patent: Oct. 6, 2020

(54) MAGNETORESISTIVE MEMORY CELL AND METHOD FOR FABRICATING THE SAME

(71) Applicant: United Microelectronics Corp., Hsinchu (TW)

(72) Inventors: Ya-Sheng Feng, Tainan (TW); Yu-Chun Chen, Kaohsiung (TW); Chiu-Jung Chiu, Tainan (TW); Hung-Chan Lin, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 72 days.

(21) Appl. No.: 16/148,852

(22) Filed: Oct. 1, 2018

(65) Prior Publication Data

US 2020/0075840 A1 Mar. 5, 2020

(30) Foreign Application Priority Data

Sep. 4, 2018 (CN) .......................... 2018 1 1024412

(51) Int. Cl.
| | |
|---|---|
| *H01L 43/02* | (2006.01) |
| *H01L 23/528* | (2006.01) |
| *H01L 23/522* | (2006.01) |
| *H01L 23/532* | (2006.01) |
| *H01F 10/32* | (2006.01) |
| *H01L 27/22* | (2006.01) |
| *H01F 41/34* | (2006.01) |
| *G11C 11/16* | (2006.01) |
| *H01L 43/12* | (2006.01) |

(52) U.S. Cl.
CPC ............ *H01L 43/02* (2013.01); *G11C 11/161* (2013.01); *H01F 10/3259* (2013.01); *H01F 41/34* (2013.01); *H01L 23/528* (2013.01); *H01L 23/5226* (2013.01); *H01L 23/53228* (2013.01); *H01L 23/53257* (2013.01); *H01L 27/228* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 9,337,415 B1 | 5/2016 | Oh et al. | |
| 9,444,035 B2 | 9/2016 | Park et al. | |
| 2005/0105325 A1* | 5/2005 | Haneda | ................... G11C 11/15 365/154 |
| 2006/0081952 A1* | 4/2006 | Lin | ....................... H01L 27/228 257/421 |

(Continued)

*Primary Examiner* — Erik Kielin
(74) *Attorney, Agent, or Firm* — J.C. Patents

(57) ABSTRACT

A magnetoresistive memory cell is provided including a substrate. An inter-layer dielectric layer is disposed on the substrate. A via structure is disposed in the inter-layer dielectric layer. A magnetic pinned layer is disposed on the via structure. A tunnel barrier layer is disposed on the magnetic pinned layer to cover a top and a sidewall of the magnetic pinned layer, wherein the tunnel barrier layer comprises a horizontal extending portion outward from a bottom of the sidewall. A magnetic free layer with a ⊓-like structure is disposed on the tunnel barrier layer, wherein the magnetic free layer is isolated from the magnetic pinned layer by the tunnel bather layer. A spacer is disposed on the sidewall of the magnetic free layer. The spacer extends to the inter-layer dielectric layer.

20 Claims, 8 Drawing Sheets

(56) References Cited

U.S. PATENT DOCUMENTS

| | | | | |
|---|---|---|---|---|
| 2010/0078763 A1* | 4/2010 | Hosotan | ............... | G11C 11/161 |
| | | | | 257/537 |
| 2012/0139069 A1* | 6/2012 | Kim | ..................... | H01L 27/228 |
| | | | | 257/421 |
| 2013/0015540 A1* | 1/2013 | Choi | ....................... | H01L 43/02 |
| | | | | 257/421 |
| 2013/0307098 A1* | 11/2013 | Lee | ......................... | H01L 43/08 |
| | | | | 257/421 |
| 2018/0346851 A1* | 12/2018 | Moon | .................... | H01L 43/08 |
| 2019/0157099 A1* | 5/2019 | Chen | ................ | H01L 21/31055 |

* cited by examiner

MAGNETORESISTIVE MEMORY CELL AND METHOD FOR FABRICATING THE SAME

CROSS-REFERENCE TO RELATED APPLICATION

This application claims the priority benefit of China application serial no. 201811024412.3, filed on Sep. 4, 2018. The entirety of the above-mentioned patent application is hereby incorporated by reference herein and made a part of this specification.

BACKGROUND

1. Field of the Invention

The present invention generally relates to semiconductor fabrication technology, and particularly to the magnetoresistive memory cell and method for fabricating the magnetoresistive memory cell.

2. Description of Related Art

Memory apparatus includes a large number of memory cells, which are arranged into a manner of cell array. Under a limited device area, to satisfy the need for increasing memory capacity, the size of memory cell in design needs to be reduced and the normal operation should also be maintained.

To the structure of magnetoresistive memory cell, it usually uses a magnetic tunnel junction (MTJ) structure to perform the function of memory cell. The basic elements of the MTJ structure include magnetic pinned layer, a tunnel barrier layer, and a magnetic free layer. The tunnel barrier layer is located between the magnetic pinned layer and the magnetic free layer. The magnetic pinned layer has the magnetization at a fixed direction. The ferromagnetic material of the magnetic free layer has magnetization but its operation direction is freely flipped at two directions according to the operation of the memory cell. As such, the operation direction and the fixed direction are at parallel state or anti-parallel state, which respectively induce different magnetoresistance values. The magnetic free layer is corresponding to a bit to store the data of "0" or "1".

The MTJ structure of the memory cell can be fabricated by the semiconductor fabrication technology, so to meet the need in reducing the device size. However, as the device size is reduced, the isolation between the magnetic free layer and the magnetic pinned layer may be poor and the are conducted, resulting in a failure of the memory cell.

As to the development, how to design the structure of magnetoresistive memory cell to be easily fabricated and to reduce the failure probability is always an issue in development.

SUMMARY OF THE INVENTION

The invention provides a structure of magnetoresistive memory cell and the fabrication method thereof, capable of easily fabricating and maintaining the isolation effect between the magnetic free layer and the magnetic pinned layer.

In an embodiment, a magnetoresistive memory cell comprises a substrate. An inter-layer dielectric layer is disposed on the substrate. A via structure is disposed in the inter-layer dielectric layer. A magnetic pinned layer is disposed on the via structure. A tunnel barrier layer is disposed on the magnetic pinned layer to cover a top and a sidewall of the magnetic pinned layer, wherein the tunnel barrier layer comprises a horizontal extending portion outward from a bottom of the sidewall. A magnetic free layer with a ⊓-like structure is disposed on the tunnel barrier layer, wherein the magnetic free layer is isolated from the magnetic pinned layer by the tunnel barrier layer. A spacer is disposed on the sidewall of the magnetic free layer and the spacer extending to the inter-layer dielectric layer.

In an embodiment, as to the magnetoresistive memory cell, the substrate comprises a silicon substrate and a metal line layer. The metal line layer is disposed on a silicon substrate, wherein the metal line layer contacts the via structure.

In an embodiment, as to the magnetoresistive memory cell, the via structure is a tungsten via and the metal line layer is a copper line layer.

In an embodiment, as to the magnetoresistive memory cell, the magnetic pinned layer is just fully covering a top surface of the via structure.

In an embodiment, as to the magnetoresistive memory cell, the magnetic pinned layer is at least fully covering a top surface of the via structure.

In an embodiment, as to the magnetoresistive memory cell, the magnetic pinned layer is covering a portion of a top surface of the via structure.

In an embodiment, as to the magnetoresistive memory cell, the tunnel barrier layer is MgO.

In an embodiment, as to the magnetoresistive memory cell, the ⊓-like structure of the magnetic free layer comprises: a horizontal portion and a peripheral portion. The peripheral portion is on a periphery of the horizontal portion, protruding to the horizontal extending portion of the tunnel barrier layer, over the sidewall of the magnetic pinned layer.

In an embodiment, as to the magnetoresistive memory cell, each of the magnetic pinned layer and the magnetic free layer is a single-layer structure or a multi-layer structure.

In an embodiment, as to the magnetoresistive memory cell, the magnetic pinned layer has a fixed magnetization in a fixed direction and the magnetic free layer has an operated magnetization in an operated direction, the fixed direction and the operated direction are parallel or anti-parallel.

In an embodiment, the invention also provides a method for fabricating magnetoresistive memory cell. The method comprises providing a substrate. An inter-layer dielectric layer is formed on the substrate. A via structure is formed in the inter-layer dielectric layer. A magnetic pinned layer is formed on the via structure. A tunnel barrier layer is formed on the magnetic pinned layer to cover a top and a sidewall of the magnetic pinned layer, wherein the tunnel barrier layer comprises a horizontal extending portion outward from a bottom of the sidewall. A magnetic free layer with a ⊓-like structure is formed on the tunnel barrier layer, wherein the magnetic free layer is isolated from the magnetic pinned layer by the tunnel barrier layer. A spacer is formed on the sidewall of the magnetic free layer, the spacer extending to the inter-layer dielectric layer.

In an embodiment, as to the method for fabricating magnetoresistive memory cell, the substrate comprises a silicon substrate and a metal line layer. The metal line layer is disposed on a silicon substrate, wherein the metal line layer contacts the via structure.

In an embodiment, as to the method for fabricating magnetoresistive memory cell, the via structure is a tungsten via and the metal line layer is a copper line layer.

In an embodiment, as to the method for fabricating magnetoresistive memory cell, the magnetic pinned layer is formed to just fully cover a top surface of the via structure.

In an embodiment, as to the method for fabricating magnetoresistive memory cell, the magnetic pinned layer is formed to at least fully cover a top surface of the via structure.

In an embodiment, as to the method for fabricating magnetoresistive memory cell, the magnetic pinned layer is formed to cover a portion of a top surface of the via structure.

In an embodiment, as to the method for fabricating magnetoresistive memory cell, the tunnel barrier layer is MgO.

In an embodiment, as to the method for fabricating magnetoresistive memory cell, the tunnel barrier layer and the magnetic free layer are formed comprising forming a preliminary tunnel barrier layer and a preliminary magnetic free layer over the substrate, fully covering the magnetic pinned layer. Then, the preliminary magnetic free layer and the preliminary tunnel barrier layer are patterned to have the ⊓-like structure. The ⊓-like structure comprises a horizontal portion and a peripheral portion on a periphery of the horizontal portion, protruding to the horizontal extending portion of the tunnel barrier layer, over the sidewall of the magnetic pinned layer.

In an embodiment, as to the method for fabricating magnetoresistive memory cell, each of the magnetic pinned layer and the magnetic free layer is formed by a single-layer structure or a multi-layer structure.

In an embodiment, as to the method for fabricating magnetoresistive memory cell, the magnetic pinned layer has a fixed magnetization in a fixed direction and the magnetic free layer has an operated magnetization in an operated direction to be parallel or anti-parallel to the fixed direction.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the technology of magnetoresistive memory cell, which includes a memory cell of a MTJ stack layer to serve as a bit to store data.

The invention has looked into the structure of magnetoresistive memory cell and found some possibly defects and then propose a structure for designing the magnetoresistive memory cell, suitable for easily fabricating and reducing the probability of device failure.

Several embodiments are provided to describe the invention. However, the invention is not just limited to the embodiments as provided.

Figure 1:
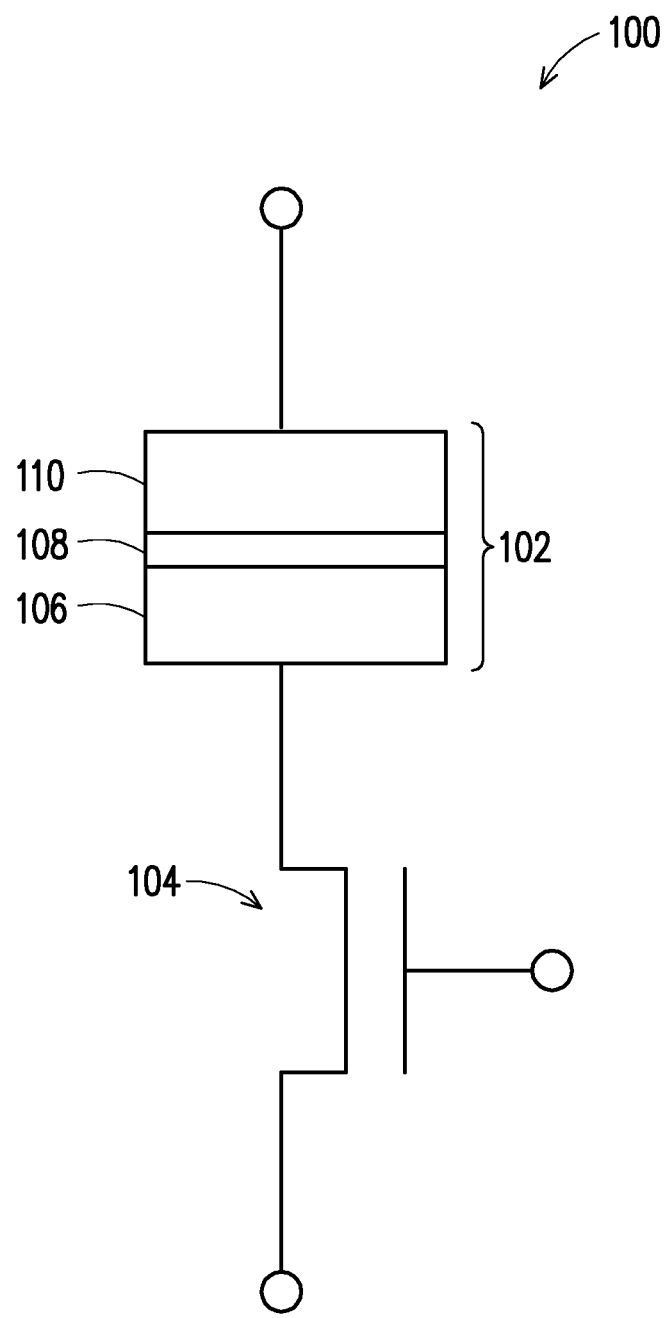
FIG. 1 is a drawing, schematically illustrating a circuit structure of a magnetoresistive memory cell, according to an embodiment of the invention.

The invention has first looked into the fabrication of magnetoresistive memory cell in detail. FIG. 1 is a drawing, schematically illustrating a circuit structure of a magnetoresistive memory cell, according to an embodiment of the invention. Referring to FIG. 1, a circuit 100 of the magnetoresistive memory cell according to an embodiment includes a magnetic memory stack layer 102 and a transistor 104 for controlling. In an example, when the transistor 104 is conducted, the magnetoresistance of the magnetic memory stack layer 102 can be read and then the stored data can be confirmed. The magnetic memory stack layer 102 usually includes a magnetic pinned layer 106 and a magnetic free layer 110. A tunnel barrier layer 108 is disposed between the magnetic pinned layer 106 and the magnetic free layer 110 to isolate to each other. The magnetic pinned layer 106 has magnetization at a fixed direction, serving as a reference direction of magnetic field without changing with the operation. The magnetic free layer 110 has magnetization at a direction, which can be freely flipped between two directions according to a writing operation, so that the direction and the fixed direction form as being parallel or anti-parallel. The magnetoresistance level for the parallel state and the anti-parallel state, such that the data as stored can be recognized.

Figure 2:
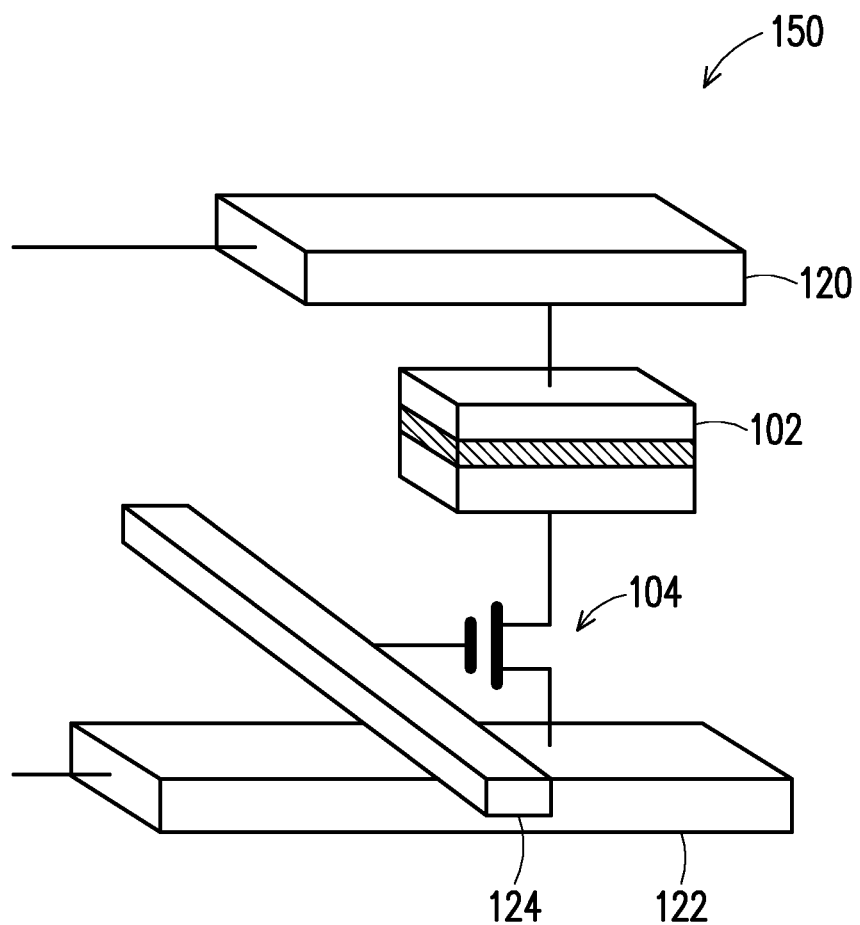
FIG. 2 is a drawing, schematically illustrating a semiconductor structure of a magnetoresistive memory cell, according to an embodiment of the invention.

FIG. 2 is a drawing, schematically illustrating a semiconductor structure of a magnetoresistive memory cell, according to an embodiment of the invention. Referring to FIG. 2, as viewed from semiconductor fabrication technology for the memory structure 150, it may include the magnetic memory stack layer 102 and the transistor 104 as accomplished in fabrication. The peripheral circuit to control the magnetic memory stack layer 102 and the transistor 104 includes a bit line 120, connecting to the magnetic free layer of the magnetic memory stack layer 102. The transistor 104 is connected between the magnetic pinned layer of the magnetic memory stack layer 102 and the source line 122. The gate of the transistor 104 is connected to the word line 124.

The foregoing embodiments for the magnetoresistive memory are used to describe the generate architecture. However, it may have various different structures according to actual designs, which also include the manner to use the magnetic memory stack layer 102 to serve as the data recording tool. The invention is not just limited to the whole applications as provided and has further looked into the magnetic memory stack layer 102.

One of the manners to fabricate the magnetic memory stack layer 102 based on the semiconductor fabrication technology is first to accomplish the magnetic stack layer and then pattern the magnetic stack layer. FIG. 3A to FIG. 3D are cross-sectional drawings, schematically illustrating a method for fabricating magnetoresistive memory cell, according to an embodiment of the invention.

Figure 3A:
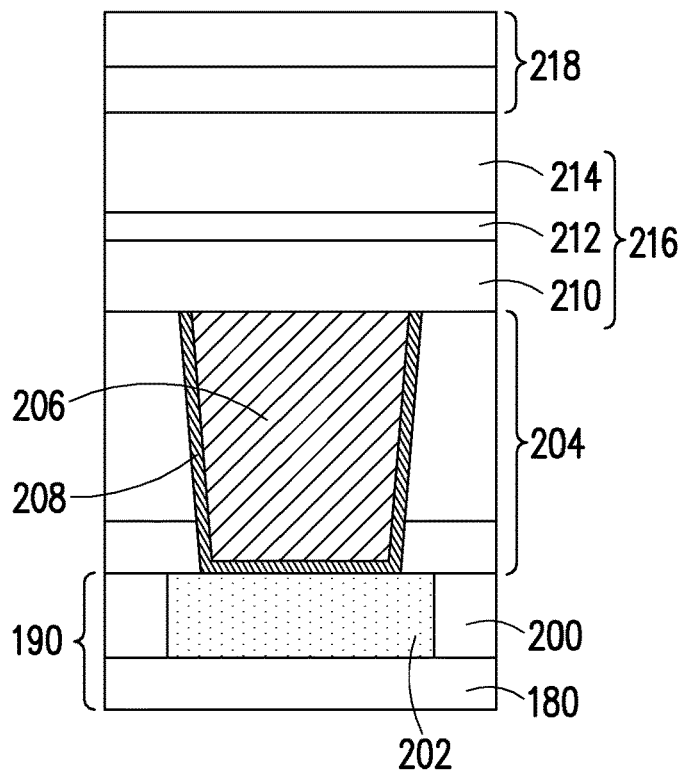
FIG. 3A to FIG. 3D are cross-sectional drawings, schematically illustrating a method for fabricating magnetoresistive memory cell, according to an embodiment of the invention.

Referring to FIG. 3A, the substrate 190 is taken as a structure base. The substrate 190 in an example includes silicon substrate 180 and a metal line layer 202 on the silicon substrate 180. As to the usual semiconductor fabrication technology, the fabrication of metal line layer 202 would be accomplished by use of an inter-layer dielectric layer 200. Material of the metal line layer 202 in an example is copper with the function to serve as interconnect. In other words, the substrate 190 represents that some device structures have been already accomplished and a magnetic memory stack layer 216 like the structure in FIG. 3D is to be subsequently formed to serve as a MTJ memory stack layer.

Another inter-layer dielectric layer 204 is subsequently formed on the substrate 190. The inter-layer dielectric layer 204 can be a single-layer structure or multi-layer structure. The embodiment takes the stack structure of two layers as an example. Semiconductor fabrication processes are used to form a via structure 206 in the inter-layer dielectric layer 204, in which a plating process and a polishing process may be used to accomplish. The via structure 206 is tungsten in an example. Further, to increase the plating quality, a plating seed layer 208 may be formed first and then the plating process is performed.

A preliminary memory stack layer 216 is subsequently formed thereon, including magnetic pinned layer 210, tunnel barrier layer 212 and magnetic free layer 214. Materials of the magnetic pinned layer 210 and the magnetic free layer 214 are ferromagnetic material. The tunnel barrier layer 212 is used to isolate the magnetic pinned layer 210 and the magnetic free layer 214 and the material of the tunnel barrier layer 212 in an example is MgO. In addition, according to the need in actual fabrication or protection, another dielectric layer 218 may be further formed thereon but the invention is not limited to the example.

Figure 3B:
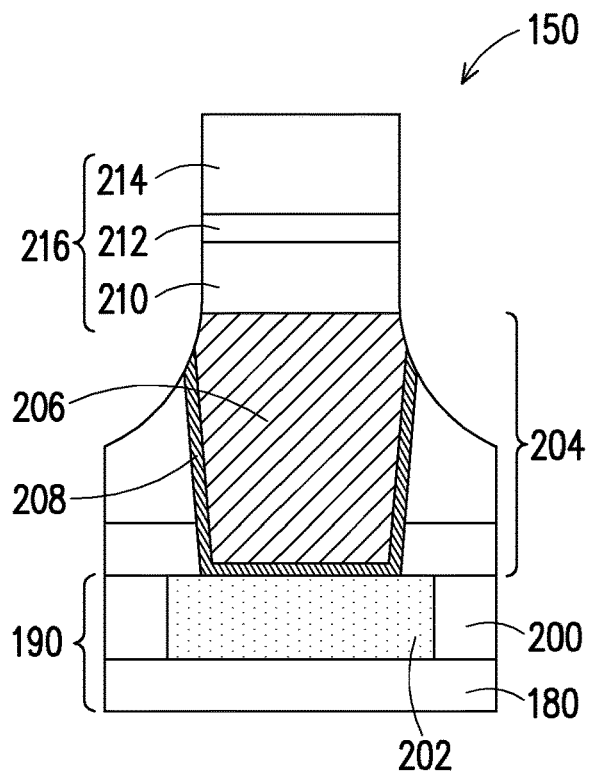

Referring to FIG. 3B, in accordance with the size of the memory cell as predetermined, a patterning process is performed on the dielectric layer 218 and the preliminary magnetic memory stack layer 216 to have the magnetic memory stack layer 216 with the intended size.

Here, the invention has observed that the patterning process includes an etching process, which would expose the corner region of the via structure 206. Further, since the magnetic pinned layer 210 and the magnetic free layer 214 are ferromagnetic material and are just isolated by the thin tunnel barrier layer 212, the sidewall of the magnetic memory stack layer 216 would possibly have residue, causing a bridge short between the magnetic pinned layer 210 and the magnetic free layer 214.

To avoid the bride short between the magnetic pinned layer 210 and the magnetic free layer 214, it needs to additionally use an ion beam etching process to further clean the residue on the sidewall, which is possibly causing the bride.

Figure 3C:
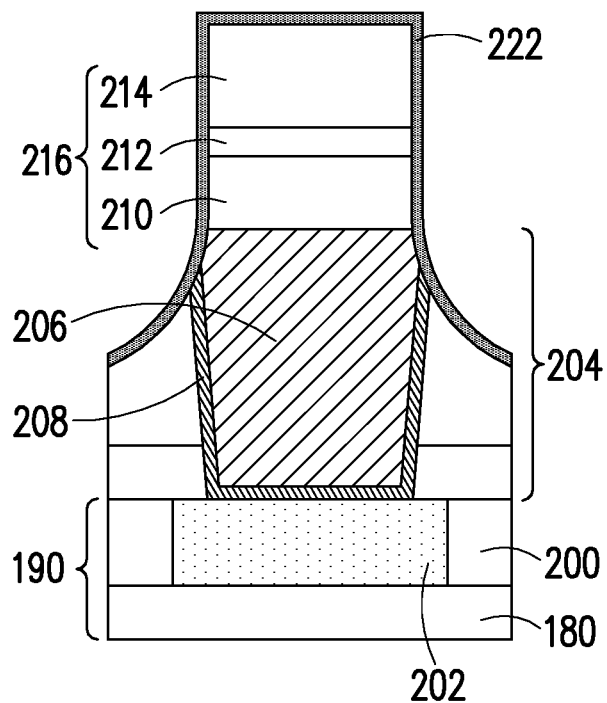
Figure 3D:
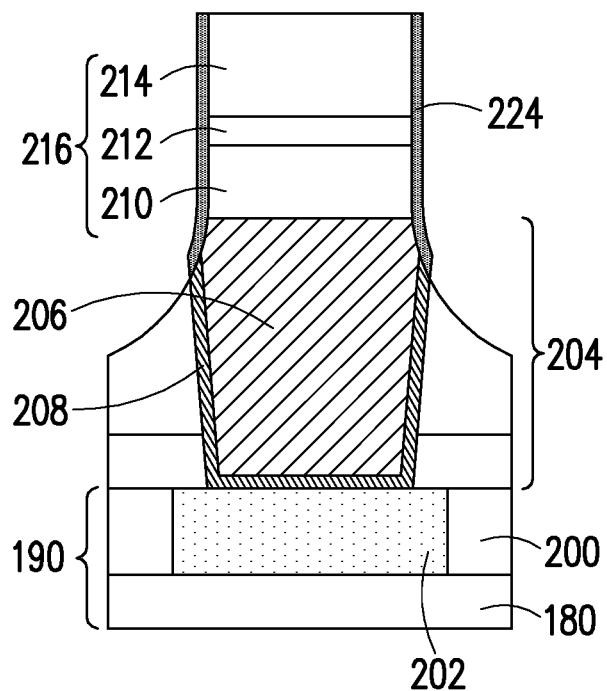

Referring to FIG. 3C, a dielectric layer 222 covers over the surface of the magnetic stack layer 216 and also the exposed corner region of the via structure 206. Referring to FIG. 3D, an etching back process is performed on the dielectric layer 222 to expose a top of the magnetic stack layer 216, in which the residual portion of the dielectric layer 222 on the sidewall forms a spacer 224 to cover the sidewall of the magnetic stack layer 216. As observed, the exposed corner region of the via structure 206 is insulated by the spacer 224. The insulation quality may be insufficient.

When looking into the fabrication process above, some defects have at least been observed in the invention. The invention has further proposed a fabrication method in another embodiment.

Figure 4A:
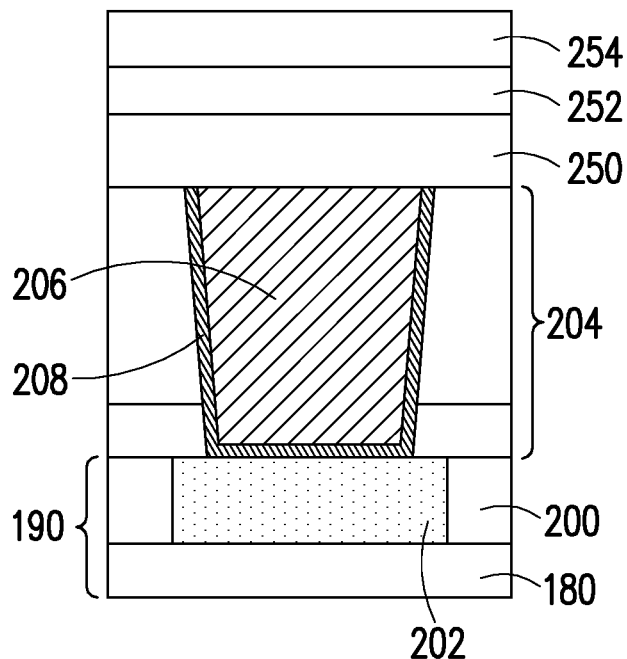
FIG. 4A to FIG. 4G are cross-sectional drawings, schematically illustrating a method for fabricating magnetoresistive memory cell, according to an embodiment of the invention.

FIG. 4A to FIG. 4G are cross-sectional drawings, schematically illustrating a method for fabricating magnetoresistive memory cell, according to an embodiment of the invention. Referring to FIG. 4A, the substrate 190, the inter-layer dielectric layer 204 and the via structure 206 are the same as in FIG. 3A without additional descriptions. Then, a preliminary magnetic pinned layer 250 is formed on the inter-layer dielectric layer 204 and contacts to the via structure 206 to have electric connection. Further, due to the need for protection of the subsequent etching process or other fabrication process, a mask layer in an example can be further formed on the magnetic pinned layer 250, including nitride layer 252 and oxide layer 254 in an example.

Figure 4B:
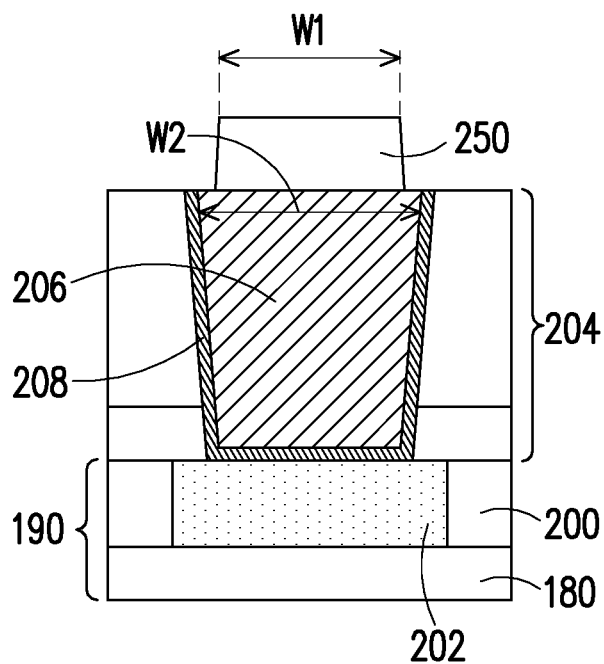

Referring to FIG. 4B, the magnetic pinned layer 250, the nitride layer 252 and the oxide layer 254 are patterning to have the magnetic pinned layer 250 with the intended size, in which the nitride layer 252 and the oxide layer 254 are also removed.

In an embodiment, the width W1 of the magnetic pinned layer 250 is smaller than the width W2 of the via structure 206. In other words, the magnetic pinned layer 250 is just covering a portion of the top surface of the via structure 206. However, the invention is not just limited thereto. According to the need, in an example, the magnetic pinned layer 250 may just fully cover the top surface of the via structure 206. In further another embodiment, the width W1 may be properly larger than the width W2.

Figure 4C:
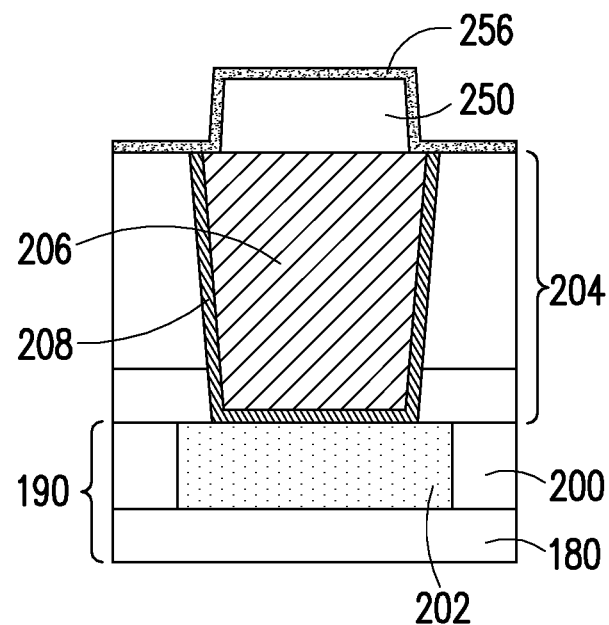

Referring to FIG. 4C, the tunnel barrier layer 256 is formed over the substrate 190, to cover the exposed surface of the magnetic pinned layer 250 and cover the inter-layer dielectric layer at periphery of the magnetic pinned layer 250.

Figure 4D:
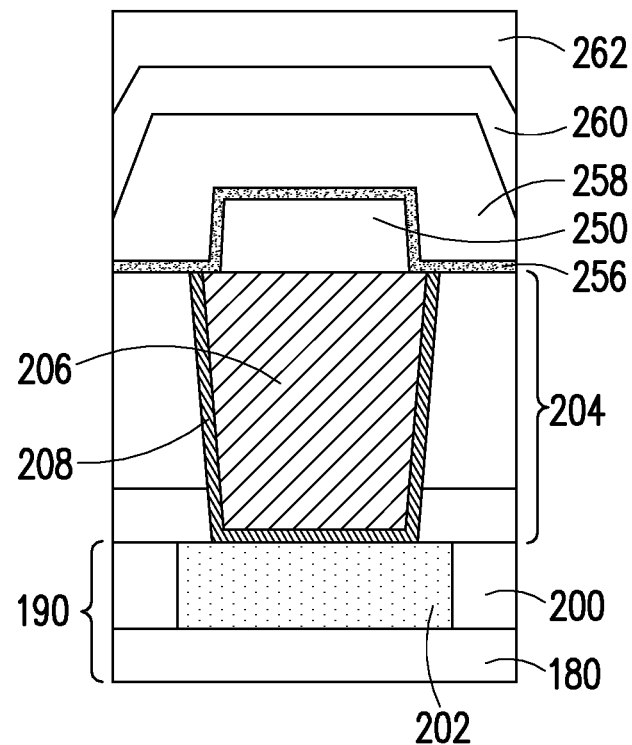

Referring to FIG. 4D, the preliminary magnetic free layer 258 is formed on the tunnel barrier layer 256. The magnetic free layer 258 and the magnetic pinned layer are isolated by the tunnel barrier layer 256. Further, the mask layer 260, 262 in different materials may be formed on the magnetic free layer 258. For example, the mask layer 260 is a material of silicon nitride and the mask layer 262 is a material of silicon oxide.

Figure 4E:
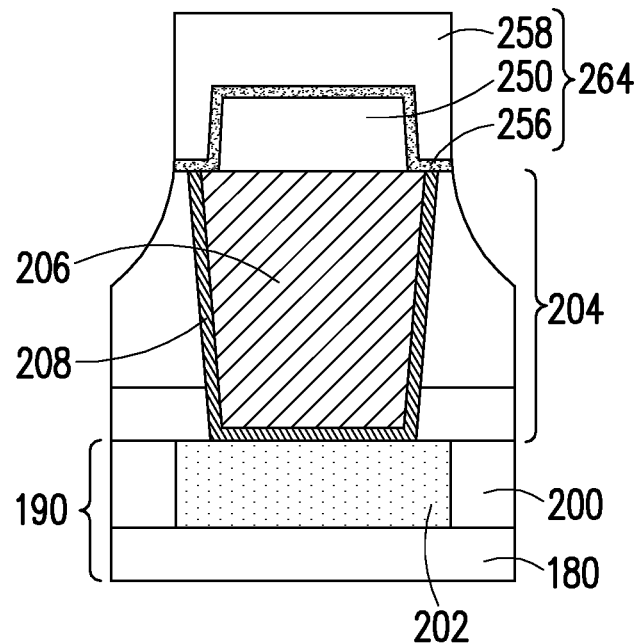

Referring to FIG. 4E, a patterning process is performed to pattern the mask layers 260, 262, the magnetic free layer 258, the tunnel barrier layer 256, and the magnetic pinned layer 250, in which the mask layers 260, 262 are also removed to expose the magnetic memory stack layer 264.

Here, the width of the magnetic free layer 258 is larger than the magnetic pinned layer 250, and then the structure of the magnetic free layer 258 becomes a ⊓-like structure. The ⊓-like structure includes a horizontal portion and a peripheral portion. The peripheral portion is on a periphery of the horizontal portion, protruding to the horizontal extending portion of the tunnel barrier layer 256, over the sidewall of the magnetic pinned layer 250. Here, the horizontal extending portion of the tunnel barrier layer 256 would also cover the via structure underneath the tunnel barrier layer, without producing exposed region. In addition, the horizontal extending portion of the tunnel barrier layer 256 may also effectively isolate the magnetic free layer 258 and the magnetic pinned layer 250, so that the magnetic free layer 258 and the magnetic pinned layer 250 have no the situation as shown in FIG. 3B, and the issue of bridge short between the magnetic free layer 258 and the magnetic pinned layer 250 may be effectively avoided. Here, a length of the horizontal extending portion of the tunnel barrier layer 256 is corresponding to the peripheral portion of the of the ⊓-like structure, not extending without limitation but within the range to maintain the normal operation for the magnetic free layer 258.

Figure 4F:
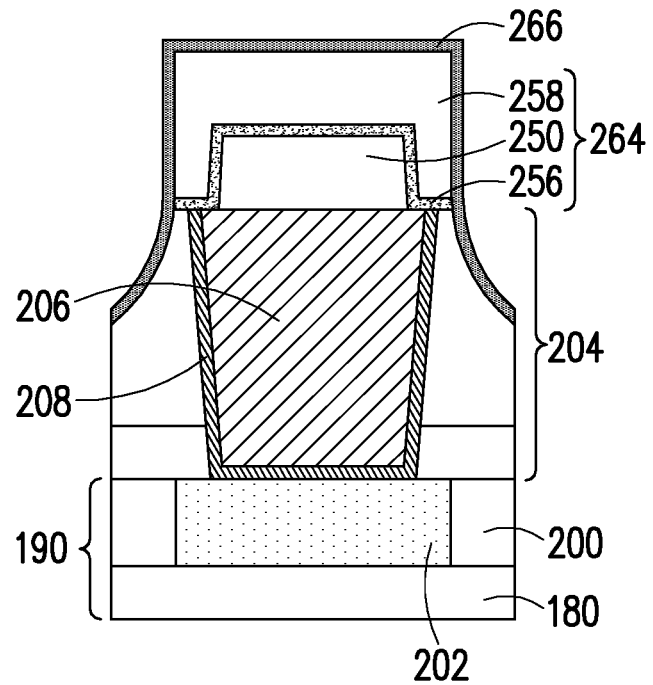
Figure 4G:
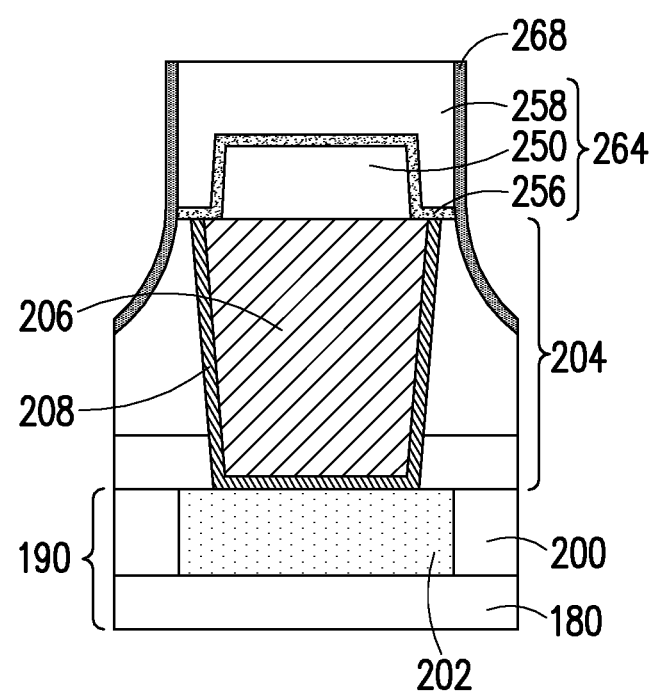

Referring to FIG. 4F, the sidewall of the magnetic free layer 258 needs to be formed with a spacer for protecting and insulating the magnetic memory stack layer 264, in which the method top form the spacer in an example is first forming a dielectric layer 266 to cover over. Referring to FIG. 4G, then, an etching back process is performed to remove a portion of the dielectric layer 266 on top of the magnetic free layer 258 and the residual portion forms the spacer 268. The process to form the spacer 268 is not just limited to above manner. The spacer 268 in an example may also extend down to the inter-layer dielectric layer 204, so to fully insulate the side part of the magnetic memory stack layer 264 to have the insulation effect.

The invention has provided the magnetic free layer 258 with the ⊓-like structure, which may at least effectively avoid the issue of bridge connection between the magnetic free layer 258 and the magnetic free layer 250. In addition, the via structure 206 may be well protected in better way for reducing the damage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetoresistive memory cell, comprising:
   a substrate;
   an inter-layer dielectric layer, disposed on the substrate;
   a via structure, disposed in the inter-layer dielectric layer;
   a magnetic pinned layer, disposed on the via structure;
   a tunnel barrier layer, disposed on the magnetic pinned layer to cover a top and a sidewall of the magnetic pinned layer, wherein the tunnel barrier layer comprises a horizontal extending portion outward from a bottom of the sidewall of the magnetic pinned layer;
   a magnetic free layer with a cross-section structure of the magnetic free layer as being a ⊓-like structure, disposed on the tunnel barrier layer, wherein the magnetic free layer is isolated from the magnetic pinned layer by the tunnel barrier layer, wherein a cross-sectional end surface of the ⊓-like structure is just fully disposed on the horizontal extending portion of the tunnel barrier layer and a sidewall of the ⊓-like structure is substantially vertical straight onto the horizontal extending portion without including horizontally outward extending portion; and
   a spacer, disposed on the sidewall of the magnetic free layer and the spacer extending to the inter-layer dielectric layer.

2. The magnetoresistive memory cell of claim 1, wherein the substrate comprises:
   a silicon substrate; and
   a metal line layer, disposed on a silicon substrate, wherein the metal line layer contacts the via structure.

3. The magnetoresistive memory cell of claim 2, wherein the via structure is a tungsten via and the metal line layer is a copper line layer.

4. The magnetoresistive memory cell of claim 1, wherein the magnetic pinned layer is just fully covering a top surface of the via structure.

5. The magnetoresistive memory cell of claim 1, wherein the magnetic pinned layer is at least fully covering a top surface of the via structure.

6. The magnetoresistive memory cell of claim 1, wherein the magnetic pinned layer is covering a portion of a top surface of the via structure.

7. The magnetoresistive memory cell of claim 1, wherein the tunnel barrier layer is MgO.

8. The magnetoresistive memory cell of claim 1, wherein the ⊓-like structure of the magnetic free layer comprises:
   a horizontal portion; and
   a peripheral portion, on a periphery of the horizontal portion, protruding to the horizontal extending portion of the tunnel barrier layer, over the sidewall of the magnetic pinned layer.

9. The magnetoresistive memory cell of claim 1, wherein each of the magnetic pinned layer and the magnetic free layer is a single-layer structure or a multi-layer structure.

10. The magnetoresistive memory cell of claim 1, wherein the magnetic pinned layer has a fixed magnetization in a fixed direction and the magnetic free layer has an operated magnetization in an operated direction, the fixed direction and the operated direction are parallel or anti-parallel.

11. A method for fabricating magnetoresistive memory cell, comprising:
    providing a substrate;
    forming an inter-layer dielectric layer, on the substrate;
    forming a via structure in the inter-layer dielectric layer;
    forming a magnetic pinned layer on the via structure;
    forming a tunnel barrier layer on the magnetic pinned layer to cover a top and a sidewall of the magnetic pinned layer, wherein the tunnel barrier layer comprises a horizontal extending portion outward from a bottom of the sidewall of the magnetic pinned layer;
    forming a magnetic free layer with a cross-section structure of the magnetic free layer as being a ⊓-like structure on the tunnel barrier layer, wherein the magnetic free layer is isolated from the magnetic pinned layer by the tunnel barrier layer, wherein a cross-sectional end surface of the ⊓-like structure is just fully disposed on the horizontal extending portion of the tunnel barrier layer and a sidewall of the ⊓-like structure is substantially vertical straight onto the horizontal extending portion without including horizontally outward extending portion; and
    forming a spacer on the sidewall of the magnetic free layer, the spacer extending to the inter-layer dielectric layer.

12. The method for fabricating magnetoresistive memory cell of claim 11, wherein the substrate comprises:
    a silicon substrate; and
    a metal line layer, disposed on a silicon substrate, wherein the metal line layer contacts the via structure.

13. The method for fabricating magnetoresistive memory cell of claim 12, wherein the via structure is a tungsten via and the metal line layer is a copper line layer.

14. The method for fabricating magnetoresistive memory cell of claim 11, wherein the magnetic pinned layer is formed to just fully cover a top surface of the via structure.

15. The method for fabricating magnetoresistive memory cell of claim 11, wherein the magnetic pinned layer is formed to at least fully cover a top surface of the via structure.

16. The method for fabricating magnetoresistive memory cell of claim 11, wherein the magnetic pinned layer is formed to cover a portion of a top surface of the via structure.

17. The method for fabricating magnetoresistive memory cell of claim 11, wherein the tunnel barrier layer is MgO.

18. The method for fabricating magnetoresistive memory cell of claim 11, wherein the tunnel barrier layer and the magnetic free layer are formed comprising:
    forming a preliminary tunnel barrier layer and a preliminary magnetic free layer over the substrate, fully covering the magnetic pinned layer; and
    patterning the preliminary magnetic free layer and the preliminary tunnel barrier layer, to have the ⊓-like structure, wherein the ⊓-like structure comprises:
  a horizontal portion; and
  a peripheral portion, on a periphery of the horizontal portion, protruding to the horizontal extending portion of the tunnel barrier layer, over the sidewall of the magnetic pinned layer.

19. The method for fabricating magnetoresistive memory cell of claim 11, wherein each of the magnetic pinned layer and the magnetic free layer is formed by a single-layer structure or a multi-layer structure.

20. The method for fabricating magnetoresistive memory cell of claim 11, wherein the magnetic pinned layer has a fixed magnetization in a fixed direction and the magnetic free layer has an operated magnetization in an operated direction to be parallel or anti-parallel to the fixed direction.

* * * * *